US 7,023,229 B2

(12) United States Patent
Maesaki et al.

(10) Patent No.: US 7,023,229 B2
(45) Date of Patent: Apr. 4, 2006

(54) DYNAMIC BURN-IN EQUIPMENT

(75) Inventors: Yoshihiro Maesaki, Kawasaki (JP); Hiroshi Teshigawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/869,966

(22) Filed: Jun. 18, 2004

(65) Prior Publication Data

US 2004/0232933 A1   Nov. 25, 2004

Related U.S. Application Data

(63) Continuation of application No. PCT/JP02/12854, filed on Dec. 9, 2002.

(30) Foreign Application Priority Data

Dec. 19, 2001   (JP)   ............................. 2001-386153

(51) Int. Cl.
*G01R 31/302*   (2006.01)
*G01R 31/26*   (2006.01)

(52) U.S. Cl. ................... 324/760; 324/765; 324/158.1; 324/752

(58) Field of Classification Search ................ 324/760, 324/158.1, 765, 754, 155.1; 165/80.6, 80.3; 374/121
See application file for complete search history.

(56) References Cited

U.S. PATENT DOCUMENTS 5,414,370 A * 5/1995 Hashinaga et al. ......... 324/760
5,473,259 A * 12/1995 Takeda ........................ 324/760
6,215,324 B1   4/2001 Yoshida
6,262,584 B1 * 7/2001 Kurosu et al. .............. 324/760

FOREIGN PATENT DOCUMENTS

| JP | 63115074 | 5/1988 |
| JP | 01053174 | 3/1989 |
| JP | 08076857 | 3/1996 |
| JP | 2000097990 | 4/2000 |
| JP | 2000-206176 | 7/2000 |
| JP | 2001272434 | 10/2001 |
| JP | 2001324390 | 11/2001 |

* cited by examiner

*Primary Examiner*—Vinh Nguyen
*Assistant Examiner*—Jimmy Nguyen
(74) *Attorney, Agent, or Firm*—Staas & Halsey LLP

(57) ABSTRACT

An infrared sensor is provided in a burn-in chamber. The surface temperatures of two or more semiconductor devices are measured by the sensor. A control unit calculates the internal temperatures of the semiconductor devices based on the thermal resistance values of the semiconductor device packages and controls the temperature inside the burn-in chamber so that the average of the internal temperatures is brought to a desired temperature by using a temperature controller. Further, an acceleration coefficient is obtained based on the internal temperatures, a burn-in time is determined based on the acceleration coefficient and a preliminarily given accelerated period, and a burn-in acceleration test is conducted. Moreover, when a defective semiconductor is found, the defective portion of the defective semiconductor device is specified based on the surface temperature distribution of the semiconductor device measured by the infrared sensor.

8 Claims, 6 Drawing Sheets

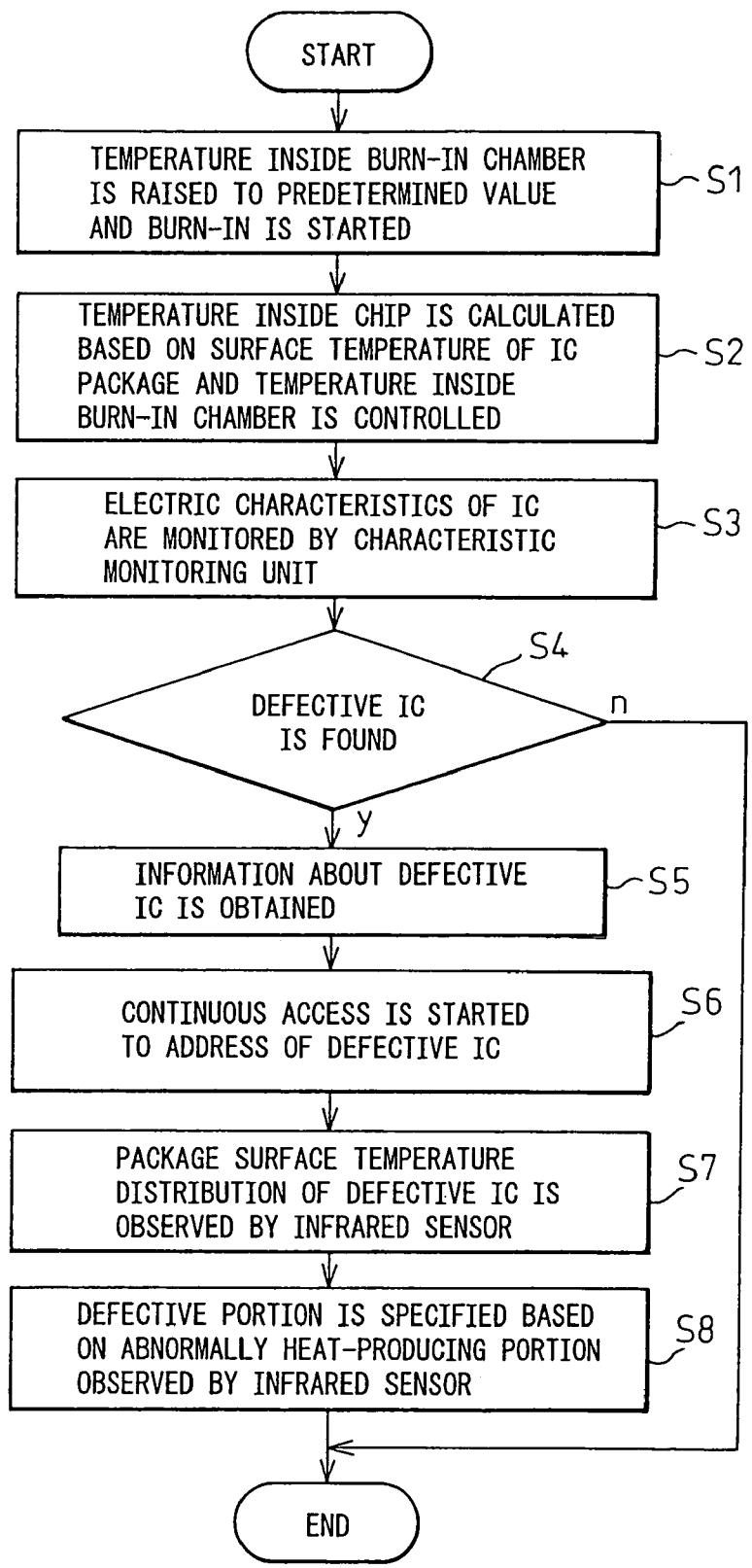

DYNAMIC BURN-IN EQUIPMENT

CROSS-REFERENCE TO RELATED APPLICATIONS

This application is based upon, and claims the priority of, Japanese Patent Application No. 2001-386153, filed on Dec. 19, 2001, the contents being incorporated herein by reference, and a continuation of PCT/JP02/12854, filed on Dec. 9, 2002.

BACKGROUND OF THE INVENTION

1. Field of the Invention

The present invention relates to a burn-in equipment for screening out a defective semiconductor and, more particularly, to a burn-in equipment capable of conducting burn-in at an optimally set burn-in temperature.

2. Description of the Related Art

Conventionally, dynamic burn-in screen test is carried out when, for example, semiconductor devices are received, by burning in the semiconductor devices in a burn-in chamber while inputting burn-in signals to the semiconductor devices from a signal generator.

A burn-in equipment comprises, for example, a burn-in chamber, a characteristic monitoring unit made up of an IC tester, etc., a temperature controller for controlling the temperature inside the burn-in chamber, a burn-in control unit for controlling start and stop of burn-in and a timer unit for setting a burn-in time.

A semiconductor device to be tested, such as an LSI, is mounted on an IC socket provided to a burn-in card and accommodated in the burn-in chamber.

In the burn-in chamber, a temperature sensor for measuring the temperature inside the chamber is provided. The temperature inside the burn-in chamber is detected by the temperature sensor, the temperature inside the burn-in chamber is kept at a predetermined temperature by the temperature controller, a burn-in signal is inputted, and a burn-in acceleration test of a semiconductor device is conducted.

Conventionally, the temperature inside a burn-in chamber is set in advance to the value which is calculated by an operator based on the thermal resistance value, etc., of the specifications of the IC so that the temperature inside an IC chip will be brought to a desired temperature.

However, in a conventional burn-in equipment, the power source current may fluctuate because of the variations in the quality of production lots the semiconductor devices, therefore, the burn-in acceleration test was not always conducted at an expected temperature inside a chip.

Further, the burn-in acceleration test was not necessarily conducted with a proper burn-in time.

Furthermore, in a conventional burn-in equipment, it was impossible to analyze in detail, e.g. which portion of an IC was defective, when a defect was found.

SUMMARY OF THE INVENTION

The present invention has been developed in order to solve the above-mentioned problems of the prior art and the object thereof is to provide a burn-in equipment capable of accurately controlling the temperature inside a chip of a semiconductor device, conducting an optimum burn-in acceleration test and analyzing a defective IC.

In a burn-in chamber, an infrared measuring unit capable of measuring the surface temperature and the surface temperature distribution of a semiconductor device is provided. Then, the internal temperature of the semiconductor device is obtained based on the surface temperatures of two or more semiconductor devices measured by the measuring unit and the thermal resistance values of the semiconductor packages, and the temperature inside the burn-in chamber is controlled based on the average of the internal temperatures of the semiconductor devices.

Further, an acceleration coefficient is obtained based on the internal temperature obtained as above, a burn-in time is determined based on the acceleration coefficient and a preliminarily given acceleration period, and a burn-in acceleration test of the semiconductor device is conducted within the burn-in time.

Furthermore, when a defective semiconductor is found during the burn-in, the defect address of the semiconductor device in which a defect has occurred is accessed continuously, the surface temperature distribution of the semiconductor device is measured by the measuring unit, and the defective portion of the semiconductor device is specified.

BRIEF DESCRIPTION OF THE DRAWINGS

The present invention is explained below with reference to the accompanying drawings.

FIG. 4 is a flow chart showing a series of processes in a third embodiment according to the present invention.

FIG. 6 is a diagram showing an example of a conventional burn-in signal when a general-purpose memory goes through burn-in.

DESCRIPTION OF THE PREFERRED EMBODIMENTS

First, in order to clarify the function and effect of the present invention, a general burn-in equipment to which the present invention is not applied is explained below with reference to FIG. 5A, FIG. 5b and FIG. 6.

Figure 5A:
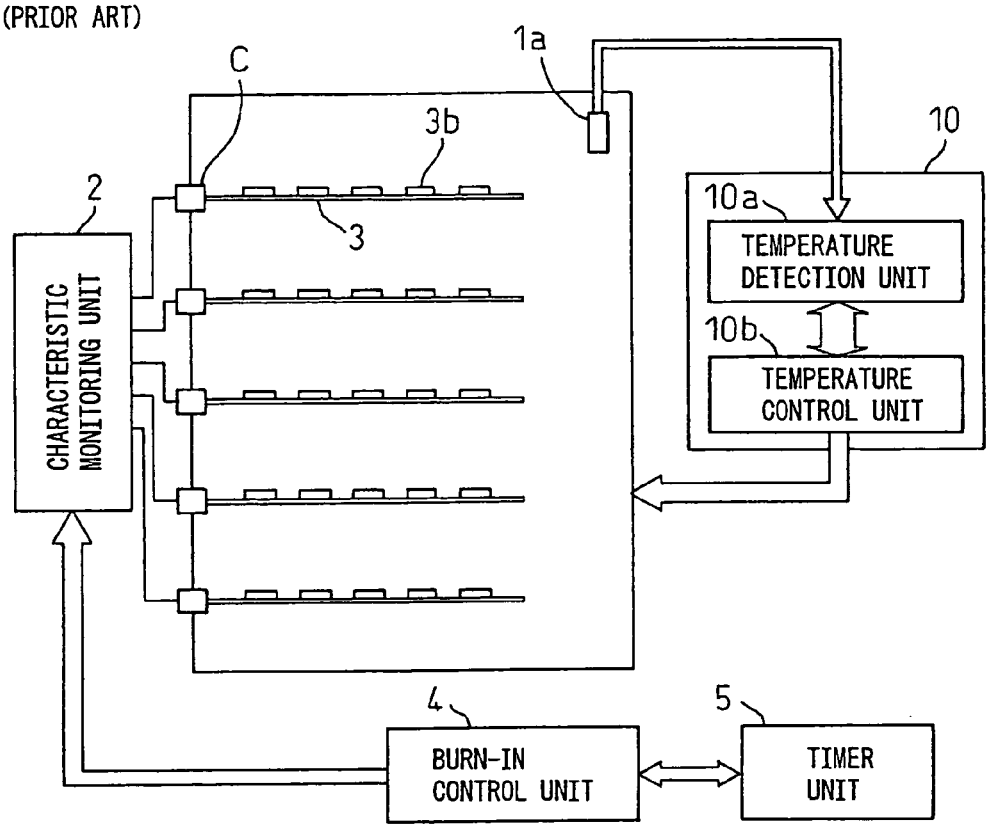
FIG. 5A and FIG. 5B are diagrams showing configuration examples of a conventional burn-in equipment and burn-in card.
Figure 5B:
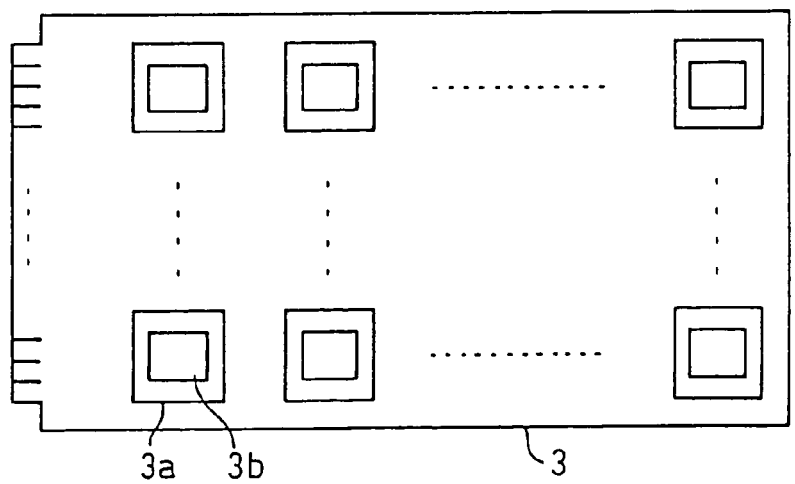

FIG. 5A shows a general configuration of a conventional burn-in equipment and FIG. 5B shows a configuration example of a burn-in card. FIG. 6 shows an example of a burn-in signal when general-purpose memory devices such as a dynamic random access memory (DRAM) or a static random access memory (SRAM) go through burn-in.

As shown in FIG. 5A, for example, a burn-in equipment comprises a burn-in chamber 1, a characteristic monitoring unit 2 comprising an IC tester, a temperature controller 10 for controlling the temperature inside the burn-in chamber 1, a burn-in control unit 4 for controlling start/stop of burn-in and a timer unit 5 for setting a burn-in time.

A semiconductor device 3b such as LSI, which is an object to be tested, is mounted on an IC socket 3a arranged to a burn-in card 3.

The burn-in card 3 on which the semiconductor device (also referred to as the IC, hereinafter) 3b has been mounted is accommodated in the burn-in chamber 1 and attached to a connector C arranged in the burn-in chamber.

In the burn-in chamber 3, a temperature sensor 1a for measuring the temperature inside the chamber is provided, and the temperature inside the burn-in chamber 1 is detected by the temperature sensor 1a and is sent to a temperature detection unit 10a in the temperature controller 10. A temperature control unit 10b controls, for example, a heater (not shown), so that the temperature inside the burn-in chamber 1 inputted from the temperature detection unit 10a is brought to a predetermined value.

The inside of the burn-in chamber 1 is kept at a predetermined temperature by the temperature controller 10, a burn-in signal is inputted to the semiconductor device 3b mounted on the burn-in card 3 from the characteristic monitoring unit 2 via the connector C, and a burn-in acceleration test of the semiconductor device 3b is conducted.

Figure 6:
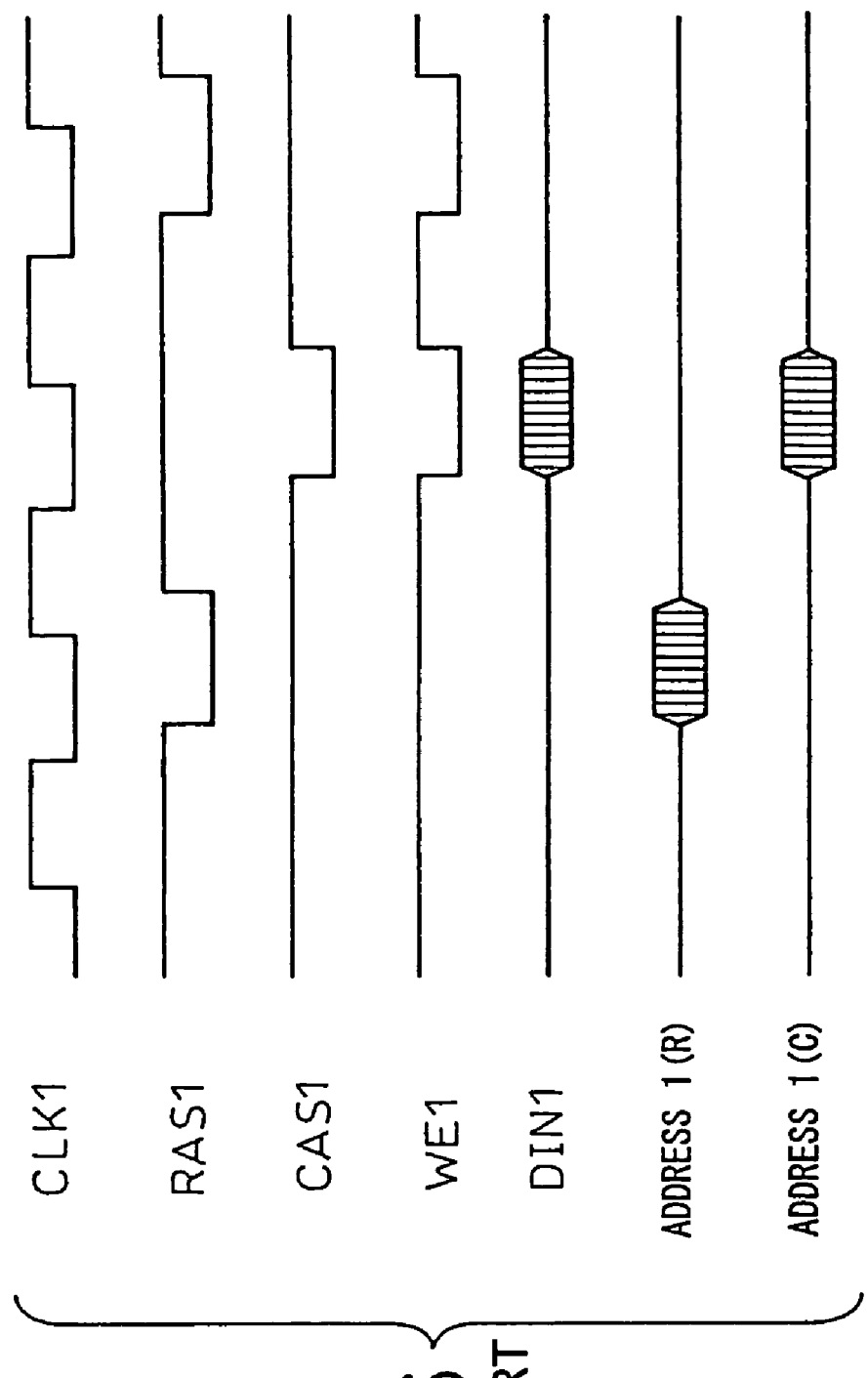

As shown in FIG. 6, a burn-in signal consists of a clock CLK, row address strobe RAS (simply referred to as the RAS, hereinafter), column address strobe CAS (simply referred to as the CAS, hereinafter), write enable WE, data DIN, row address AD (R) and column address AD (C). The address is incremented and a process of writing data to each cell of the memory is carried out.

The characteristic monitoring unit 2 in FIG. 5A applies the burn-in signal to each IC, which is the object to be tested, examines whether each IC 3b functions normally, and screens out defective ICs.

Conventionally, the temperature inside the burn-in chamber 1 is calculated in advance (based on the thermal resistance value, etc. of the specifications of the IC) and set by an operator so that the temperature inside an IC chip will be brought to a desired temperature.

For example, when the thermal resistance value of an IC is 60 (° C./W), a temperature difference $\Delta Tj$ between the internal temperature and the external temperature of the IC is calculated according to the following expression (1), and if the temperature inside the IC chip is set to Tj (125° C., for example), an ambient temperature Ta (that is, the temperature inside the burn-in chamber) of the IC is calculated according to the following expression (2). The temperature controller controls the temperature inside the burn-in chamber to be calculated temperature Ta.

$$\Delta Tj = \text{(Power source voltage)} \times \text{(power source current)} \times \quad (1)$$

$$\text{(thermal resistance value)}$$

$$= 3.6 \text{ V} \times 100 \text{ mA} \times 60° \text{ C./W} = 21.6° \text{ C.}$$

$$Ta = Tj - \Delta Tj = 125 - 21.6 = 103.4° \text{ C.} \quad (2)$$

A conventional burn-in equipment has the following problem. The power source current may fluctuate because of the variations in the quality of production lots the semiconductor devices manufactured, therefore, the burn-in acceleration test is not always conducted at an expected temperature inside a chip.

When a life test, for example, of a semiconductor device is conducted, it is usual to set the temperature condition or the like severer than in an actual use in order to shorten the test time, and the acceleration factor k (accelerated test time Tk/burn-in time Tbn) is determined based on the product of the temperature according to the Arrhenius theorem (temperature inside the chip) and the voltage. The accelerated test time Tk is a value obtained by converting a burn-in time into an operating time of a semiconductor device under normal use conditions.

Therefore, the burn-in time Tbn when the life test is conducted is determined so that the product of the acceleration coefficient k and the burn-in time is equal to the preliminarily given accelerated test time Tk.

Conventionally, as the temperature inside the chip is not necessarily an expected value, the acceleration coefficient is an estimated one and the burn-in time is determined using the estimated acceleration coefficient. Therefore, the burn-in acceleration test is not always conducted with a proper burn-in time.

Further, it is necessary to specify which portion of an IC is defective in order to conduct an analysis of the defective IC. In a conventional burn-in equipment, however, it is impossible to specify the defective portion of the IC to conduct a detailed analysis on the defective portion.

The present invention has been developed in order to solve the above-mentioned problems of the prior art. The embodiments of the present invention are explained below with reference to FIG. 1 to FIG. 4.

Figure 1:
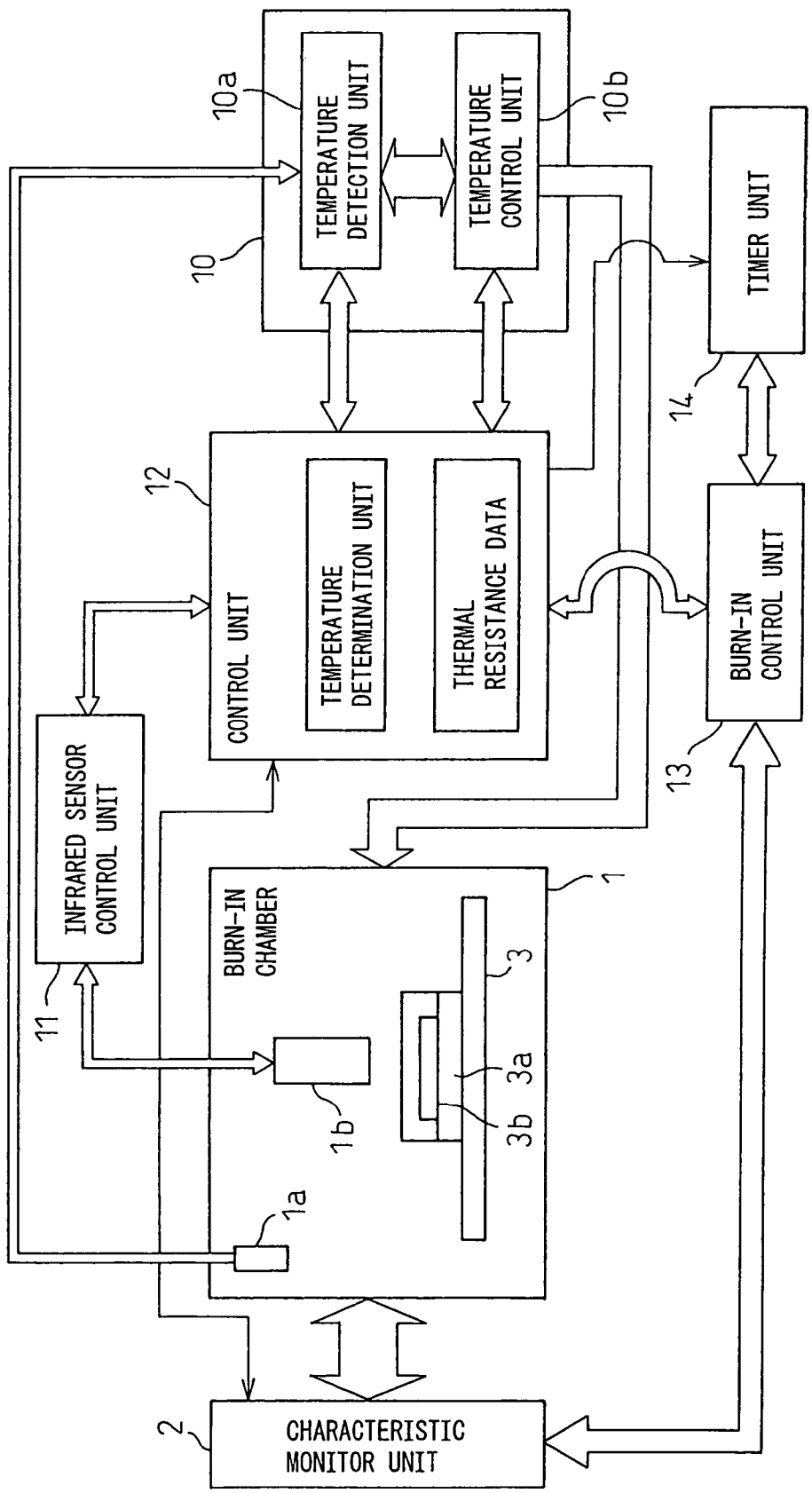
FIG. 1 is a diagram showing the configuration of a burn-in equipment in an embodiment according to the present invention.

FIG. 1 is a diagram showing the configuration of a burn-in equipment in an embodiment according to the present invention.

Referring to FIG. 1, reference number 1 denotes a burn-in chamber and a burn-in card 3 is accommodated in the burn-in chamber 1, and an IC 3b, which is an object to be inspected, is mounted on an IC socket 3a attached to the burn-in card 3. Although only one IC 3b is shown in FIG. 1, two or more ICs are actually mounted on the burn-in card 3 as shown in FIG. 5B.

To the IC or semiconductor device 3b mounted on the burn-in card 3, a burn-in signal such as shown in FIG. 6 is inputted from the characteristic monitoring unit 2 comprising an IC tester, as described above, and the electric characteristics of each IC are monitored by the characteristic monitoring unit 2.

Reference number 1a denotes the temperature sensor for detecting the temperature inside the burn-in chamber and reference number 10 denotes the temperature controller. The temperature inside the burn-in chamber detected by the temperature sensor 1a is sent out to the temperature controller 10 and the temperature controller 10 controls the heater and soon provided in the burn-in chamber 1, so that the temperature inside the burn-in chamber is brought to a predetermined value.

In the burn-in chamber 1, an infrared sensor 1b controlled by an infrared sensor control unit 11 is provided, in addition to the temperature sensor 1a.

The infrared sensor 1b is a scanning type sensor as disclosed, for example, in Japanese Unexamined Patent Publication (Kokai) No. 1-53174, and scans, under the control of the infrared sensor control unit 11, the surface of each IC package accommodated in the burn-in chamber to measure the surface temperature thereof or the surface temperature distribution of a specified IC package. As the infrared sensor 1b, various infrared sensors commercially available can be used, in addition to that disclosed in the above-mentioned publication.

The surface temperature, the surface temperature distribution and so on, of the IC detected by the infrared sensor 1b are sent to a control unit 12 via the infrared sensor control unit 11.

The control unit 12 obtains the temperature inside the IC chip based on the surface temperature of the IC detected by the infrared sensor 1b and the thermal resistance value data of the IC, as will be described later, and controls the temperature controller 10 so that the temperature inside the chip is brought to a desired value. The control unit 12 also determines a burn-in time based on the temperature inside the chip and sets the burn-in time to a timer unit 14, as will be described later. Further, the control unit 12 controls a burn-in control unit 13 and starts and/or stops the burn-in.

Furthermore, as will be described later, when a defective IC is found during burn-in, the control unit 12 sends out a burn-in signal continuously to the address of the defective IC from the characteristic monitoring unit 2 and specifies the abnormally heat-producing portion based on the surface temperature distribution of the defective IC measured by the infrared sensor 1b.

(1) First Embodiment

Conventionally, as described above, a burn-in acceleration test is not always conducted at an expected temperature Tj inside a chip because of the variations in the quality of ICs. In the present embodiment, therefore, the temperature inside an IC chip is found based on the surface temperature of the IC mounted on a burn-in card accommodated in a burn-in chamber and the temperature inside the burn-in chamber is set to an optimum value.

Figure 2:
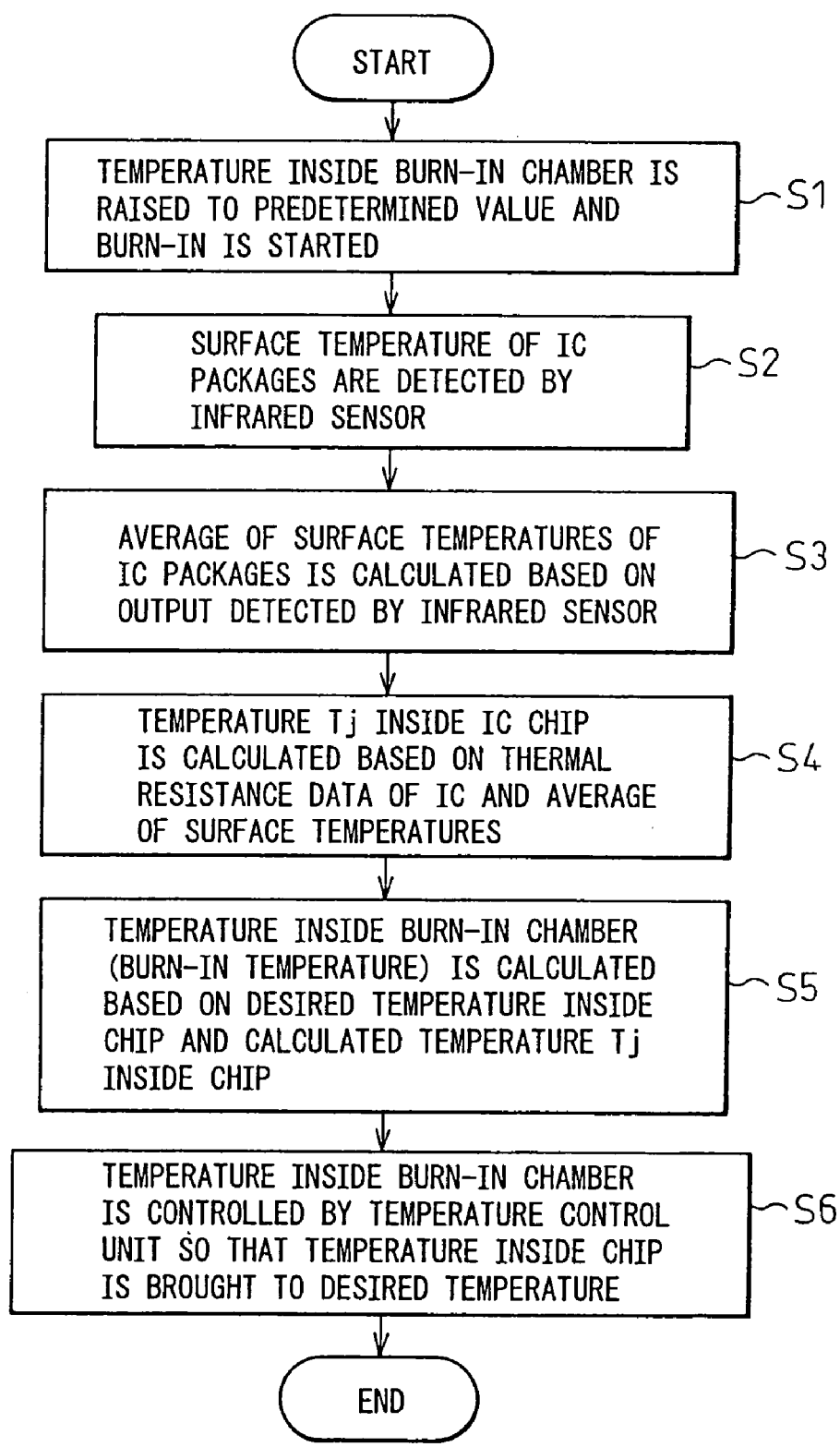
FIG. 2 is a flow chart showing a series of processes in a first embodiment according to the present invention.

FIG. 2 is a flow chart showing a series of processes performed by the control unit 12 in the present embodiment and the present embodiment is explained with reference to FIG. 2.

A burn-in card on which an IC has been mounted is accommodated in the burn-in chamber 1 as shown in FIG. 1. The control unit 12 raises the temperature inside the burn-in chamber 1 to a predetermined temperature by using the temperature controller 10 and sends out a burn-in start signal to the burn-in control unit 13 (step S1 in FIG. 2). Due to this, the characteristic monitoring unit 2 sends out a burn-in signal to each IC 3b mounted on the burn-in card 3 in the burn-in chamber 1.

The infrared sensor 1b detects the surface temperatures of two or more IC packages and sends them to the control unit 12. The control unit 12 calculates an average of the surface temperatures of the IC packages detected by the infrared sensor 1b (steps S2 and S3). Then, the temperature Tj inside the IC chip is calculated based on an average Ts of the surface temperatures of the IC packages (step S4).

In other words, the difference ΔTj between the internal temperature and the surface temperature of the IC can be obtained from the above-mentioned expression (1), that is, from the expression "(power source voltage)×(power source current)×(thermal resistance value of the IC package)".

The control unit 12 calculates the difference ΔTj based on the power source voltage and current supplied to the burn-in card and the thermal resistance value of the IC package given in advance, and calculates the temperature Tj inside the IC chip according to the sum of the average Ts of the surface temperatures and the difference ΔTj.

Then, the control unit 12 obtains the temperature inside the burn-in chamber 1, which will bring the temperature Tj inside the IC chip to a predetermined value (125° C., for example) (step S5), and outputs the obtained temperature to the temperature control unit 10b of the temperature controller 10 (step S6).

On the other hand, the temperature inside the burn-in chamber is detected by the temperature sensor 1a and is sent from the temperature detection unit 10a to the temperature control unit 10b. The control unit 12 controls a heater (not shown), so that the temperature inside the burn-in chamber 1 is brought to the above-mentioned temperature (step S6).

In the present embodiment, as described above, the average of the surface temperatures of the two or more ICs is obtained, the temperature inside the IC chip is calculated based on the obtained average, the power source voltage and current and the thermal resistance value of the IC package, and the temperature inside the burn-in chamber is controlled so that the temperature inside the chip is brought to a predetermined temperature. Therefore, it is possible to bring the temperature inside the chip to a desired value even if the variations in the power source current, etc., of the IC exist. As a result, it becomes possible to conduct a burn-in accelerated test at a desired temperature inside a chip.

(2) Second Embodiment

As described above, when a life test or the like of semiconductor devices is conducted, the burn-in time is determined based on the acceleration coefficient (product of the temperature inside the chip and the voltage) and the acceleration period given in advance.

According to the first embodiment described above, as the temperature inside the chip can be brought to a desired value, it is possible to accurately obtain the acceleration coefficient. Therefore, in the second embodiment, the burn-in time is calculated based on the obtained acceleration coefficient as above mentioned and the acceleration period given in advance. The burn-in is conducted with the calculated burn-in time, and the life test of the semiconductor devices are conducted.

Figure 3:
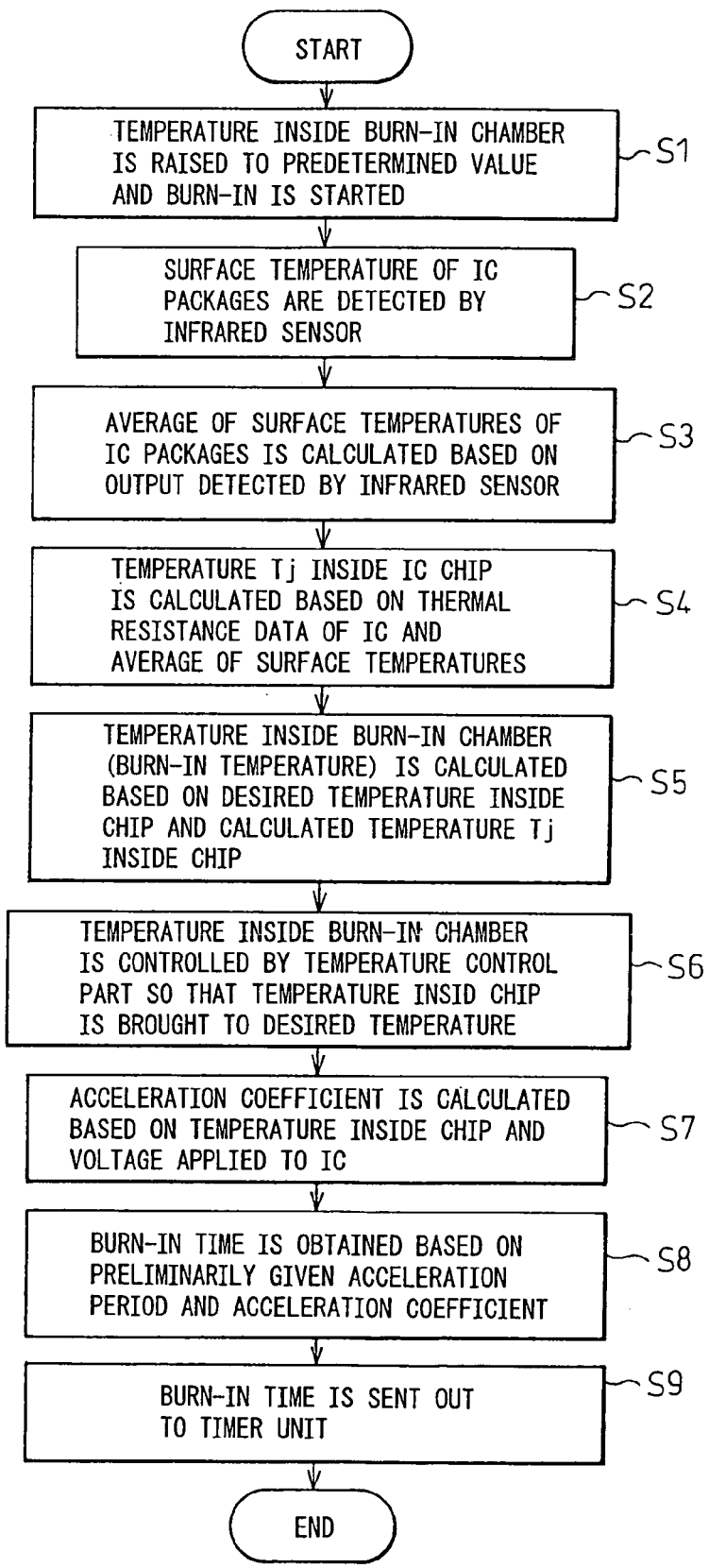
FIG. 3 is a flow chart showing a series of processes in a second embodiment according to the present invention.

FIG. 3 is a flow chart showing a series of processes performed by the control unit 12 and the second embodiment will be explained with reference to FIG. 3.

A burn-in card on which an ICs have been mounted is accommodated in the burn-in chamber 1 as shown in FIG. 1. The control unit 12 raises the temperature inside the burn-in chamber 1 to a predetermined temperature by using the temperature controller 10 and sends out a burn-in start signal to the burn-in control unit 13 (step S1 in FIG. 3). After this, the characteristic monitoring unit 2 sends out a burn-in signal to each IC 3b mounted on the burn-in card 3 in the burn-in chamber 1.

The infrared sensor 1b detects the surface temperatures of two or more IC packages and sends them to the control unit 12. The control unit 12 obtains the average of the surface temperatures of the IC packages detected by the infrared sensor 1b (steps S2 and S3).

After this, the control unit 12 calculates the temperature Tj inside the IC chip by using the average Ts of the surface temperatures of the IC packages, as described above (step S4).

Then, the control unit 12 finds a temperature inside the burn-in chamber, which will bring the temperature Tj inside the IC chip to a predetermined value (125° C., for example), and controls the temperature inside the burn-in chamber (steps S5 and S6).

On the other hand, the control unit 12 obtains the acceleration coefficient based on the temperature Tj inside the chip and the voltage V to be applied to the IC (step S7), and the burn-in time Tbn is calculated according to the inputted acceleration time Tk and the acceleration coefficient k (step S8).

In other words, as described above, the acceleration coefficient k is calculated according to the expression [temperature Tj]×[voltage V], and the acceleration time Tk is calculated according to the expression [acceleration coefficient k]×[burn-in time Tbn], therefore, the burn-in time can be calculated according to the expression Tk/Tj×V.

The control unit 12 calculates the burn-in time Tbn, as described above, and sets the calculated burn-in time Tbn to the timer unit 14 (step S9 in FIG. 3). When the set time elapses after the start of the burn-in, the timer unit 14 sends out a stop signal to the burn-in control unit 13 to end the burn-in acceleration test.

In the present embodiment, the acceleration coefficient is determined based on the temperature inside the IC chip, the burn-in time is obtained based on the acceleration coefficient, and the burn-in acceleration test is conducted. Therefore, it is possible to conduct a burn-in acceleration test with a properly set burn-in time.

(3) Third Embodiment

In order to conduct a particular analysis or the like of a defective IC, the IC can be examined to specify a defective portion. In the third embodiment, when a defective IC is found during the burn-in acceleration test, it is possible to efficiently carry out the analysis of the defective IC by specifying the defective portion of the defective IC based on the surface temperature distribution of the defective IC.

FIG. 4 is a flow chart showing a series of processes performed by the control unit 12 in the third embodiment and the embodiment will be explained with reference to FIG. 4.

As described in the first and second embodiments, a burn-in card on which an IC has been mounted is accommodated in the burn-in chamber 1, a temperature inside the burn-in chamber 1 is raised to a predetermined temperature, a burn-in signal is sent out to each IC 3b mounted on the burn-in card 3 in the burn-in chamber 1 from the characteristic monitoring unit 2, and the burn-in acceleration test is conducted (steps S1 and S2).

The characteristic monitoring unit 2 monitors the electric characteristics of each IC and examines whether a defective IC is found (steps S3 and S4). For example, when the IC is a general-purpose memory, the characteristic monitoring unit 2 sends out the burn-in signal shown in FIG. 6, carries out a data write/read process for the address of each IC, and examines whether each IC 3b functions normally. When no defective IC is found, the characteristic monitoring unit 2 informs the control unit 12 of the result and ends the series of processes.

On the one hand, when a defective IC is found, the control unit 12 obtains information about the defective IC from the characteristic monitoring unit 2 (step S5), and commands the characteristic monitoring unit 2 to continuously access the defect address of the IC. The characteristic monitoring unit 2 starts continuously accessing the defect address (step S6 in FIG. 4).

On the other hand, the control unit 12 commands the infrared sensor control unit 11 to scan the defective IC. The infrared sensor 1b scans on the defective IC and detects the surface temperature.

The control unit 12 obtains the surface temperature distribution of the defective IC package detected by the infrared sensor 1b (step S6) and specifies the defective portion of the defective IC based on the abnormally heat-producing portion of the defective IC package detected by the infrared sensor 1b (step S7). In other words, it is possible to specify the position of the defect address on the IC package based on the surface temperature distribution because the defect address is continuously accessed, while the temperature of the portion corresponding to the address is raised higher than other portions.

It is also possible for an operator to specify a defective portion by observing a monitor display of the surface temperature distribution of the defective IC.

Thus, the third embodiment, when a defective IC is found, the defect address is accessed continuously and the surface temperature distribution of the defective IC package is detected by the infrared sensor 1b. Therefore, it is possible to specify the defective portion of the defective IC. Due to this, it is possible, for example, to open an internal defective IC for the examination of a defective portion inside the defective IC and an analysis or the like of the causes of the defect can be conducted.

As described above, according to the present invention, the following effects can be obtained.

The internal temperature of a semiconductor device is obtained and the temperature inside a burn-in chamber is controlled based on the average of the internal temperatures and, therefore, it is possible to set an optimum burn-in temperature.

Moreover, an acceleration coefficient is calculated based on the internal temperatures, a burn-in time is determined based on the acceleration coefficient and a preliminarily given accelerated period, and the burn-in accelerated test of the semiconductor is conducted with the burn-in time, therefore, it is possible to conduct a burn-in accelerated test with a proper burn-in time.

Still moreover, a defect address at which a defect of a semiconductor device has been found is accessed continuously, the surface temperature distribution of the semiconductor device is measured and a defective portion of a defective semiconductor device is specified, therefore, it will be possible to examine the defective portion and conduct an analyze of the causes of the defect, etc.

What is claimed is:

1. Dynamic burn-in equipment for conducting burn-in of semiconductor devices while burn-in signals are input to the semiconductor devices and the semiconductor devices are, accommodated in a burn-in chamber, the equipment comprising:

an infrared measuring unit measuring surface temperatures of certain semiconductor devices among the semiconductor devices; and a control unit controlling the temperature inside the burn-in chamber to make an average internal temperature $T_j$ of said certain semiconductor devices equal to a predetermined value, where $T_j$ is calculated according to the sum of an average surface temperature $T_s$ and a temperature difference $\Delta T_j$, wherein $T_s$ is an average of the surface temperatures measured by the measuring unit, and $\Delta T_j$ is a temperature difference between $T_j$ and $T_s$ that is obtained from the expression "(power source voltage)×(power source current)×(thermal resistance value of the semiconductor devices)".

2. Dynamic burn-in equipment, as set forth in claim 1, wherein the control unit conducts a burn-in acceleration test for a burn-in time $T_{bn}$ that is determined based on $T_j$ and a preliminary given acceleration period $T_k$, wherein $T_{bn}$ is calculated according to the expression $T_k/T_j \times V$, where $V$ is a voltage applied to said certain semiconductor devices.

3. Dynamic burn-in equipment for conducting burn-in of semiconductor devices while burn-in-signals are input to the semiconductor devices and the semiconductor devices are accommodated in a burn-in chamber, the equipment comprising:

a measuring unit measuring a surface temperature distribution of the semiconductor devices;

a characteristics monitoring unit monitoring characteristics of the semiconductor devices to be tested; and a control unit controlling the burn-in equipment, wherein when a defective semiconductor device is found, the control unit makes the characteristics monitoring unit continuously access a defect address of the defective semiconductor device at which a defect has been found, and specifies a defective portion of the defective semiconductor device based on a particular surface temperature, due to the defective portion, in the surface temperature distribution, which is raised higher than that of a different portion of the defective semiconductor device, measured by the measuring unit.

4. A dynamic burn-in testing process for conducting burn-in of semiconductor devices while burn-in signals are input to the semiconductor devices accommodated in a burn-in chamber, comprising:

measuring, by an infrared measuring unit, surface temperatures of certain semiconductor devices among the semiconductor devices;

calculating an average internal temperature Tj of said certain semiconductor devices according to the sum of an average Ts of the measured surface temperatures and a temperature difference ΔTj, wherein ΔTj is a temperature difference between Tj and Ts that is obtained from the expression "(power source voltage)×(power source current)×(thermal resistance value of the semiconductor devices)"; and controlling the temperature inside the burn-in chamber to make Tj equal to a predetermined value.

5. A dynamic burn-in testing process as set forth in claim 4, further comprising determining a burn-in time Tbn based on the average internal temperature Tj and a preliminary given acceleration period Tk, wherein Tbn is calculated according to the expression Tk/Tj×V, where V is a voltage applied to said certain semiconductor devices and said burn-in is conducted during said determined burn-in time Tbn.

6. A dynamic burn-in testing process for conducting burn-in of semiconductor devices while burn-in signals are input to the semiconductor devices accommodated in a burn-in chamber, comprising:

measuring a surface temperature distribution of the semiconductor devices;

monitoring characteristics of the semiconductor devices to find a defective semiconductor device;

continuously accessing a defect address of said found defective semiconductor device; and specifying a defective portion of said found defective semiconductor device based on a particular surface temperature, due to the defective portion, in said surface temperature distribution, which is raised higher than that of a different portion of said found defective semiconductor device.

7. An apparatus comprising:

means for measuring surface temperatures of semiconductor devices in a burn-in chamber while burn-in signals are input to the semiconductor devices; and means for controlling temperature inside the burn-in chamber to make an average internal temperature Tj of the semiconductor devices equal to a predetermined value, where Tj is calculated according to the sum of an average surface temperature Ts and a temperature difference ΔTj, where Ts is an average of the measured surface temperatures, and ΔTj is a temperature difference between Tj and Ts that is obtained from the expression "(power source voltage)×(power source current)×(thermal resistance value of the semiconductor devices)".

8. An apparatus comprising:

means for measuring a surface temperature distribution of semiconductor devices in a burn-in chamber while burn-in signals are input to the semiconductor devices;

means for monitoring characteristics of the semiconductor devices to find a defective semiconductor device;

means for continuously accessing a defect address of said found defective semiconductor device; and mean for specifying a defective portion of said found defective semiconductor device based on a particular surface temperature, due to the defective portion, in the measured surface temperature distribution, which is raised higher than that of a different portion of said found defective semiconductor device.

* * * * *

UNITED STATES PATENT AND TRADEMARK OFFICE
CERTIFICATE OF CORRECTION

PATENT NO.       : 7,023,229 B2                                          Page 1 of 1
APPLICATION NO.  : 10/869966
DATED            : April 4, 2006
INVENTOR(S)      : Yoshihiro Maesaki et al.

It is certified that error appears in the above-identified patent and that said Letters Patent is hereby corrected as shown below:

Column 8, Line 33, change "are," to --are--.

Column 8, Line 59, change "burn-in-signals" to --burn-in signals--.

Signed and Sealed this

Fourteenth Day of November, 2006

JON W. DUDAS
*Director of the United States Patent and Trademark Office*